United States Patent
Stevens et al.

Patent Number: 5,431,127
Date of Patent: Jul. 11, 1995

[54] PROCESS FOR PRODUCING SEMICONDUCTOR SPHERES

[75] Inventors: Gary D. Stevens, Dallas; Harvey L. Conklin, Plano, both of Tex.

[73] Assignee: Texas Instruments Incorporated, Dallas, Tex.

[21] Appl. No.: 323,317

[22] Filed: Oct. 14, 1994

[51] Int. Cl.⁶ .......................................... H01L 31/18
[52] U.S. Cl. ..................................... 117/75; 423/349; 117/7; 437/5
[58] Field of Search ............... 117/73, 75, 921, 930, 117/931, 7; 423/349, 350; 136/250; 437/5

[56] References Cited

U.S. PATENT DOCUMENTS

| | | | |
|---|---|---|---|
| 2,935,386 | 5/1960 | Selker | 117/931 |
| 3,580,732 | 5/1971 | Blakeslee et al. | 117/931 |
| 4,021,323 | 5/1977 | Kilby et al. | 204/129 |
| 4,076,456 | 2/1978 | Tree et al. | 416/241 B |
| 4,479,847 | 10/1984 | McCaldin et al. | 117/931 |
| 4,637,855 | 1/1987 | Witter et al. | 156/616 R |
| 4,676,968 | 6/1987 | Sanjurjo et al. | 423/349 |
| 5,028,546 | 7/1991 | Hotchkiss | 437/2 |
| 5,069,740 | 12/1991 | Levine et al. | 156/616.2 |
| 5,314,569 | 5/1994 | Pribat et al. | 117/931 |

Primary Examiner—R. Bruce Breneman
Assistant Examiner—Linda J. Fleck
Attorney, Agent, or Firm—Robert C. Klinger; James C. Kesterson; Richard L. Donaldson

[57] ABSTRACT

A method of manufacturing semiconductor particles (30) of uniform mass. A template (12) is used to meter out uniform mass piles (28) of semiconductor feedstock upon a refractory layer (14). These piles (28) of semiconductor feedstock are then melted briefly to obtain semiconductor particles (30) of uniform mass. Silica is the preferred refractory layer, and is separated from the particles after the melt procedure. Subsequent melt procedures can be implemented to ultimately obtain perfect spheres of the semiconductor material. The present invention is well suited for forming semiconductor spheres to be implemented in photovoltaic solar cells. Semiconductor grade or metallurgical grade feedstock can be implemented to obtain particles of high purity. High yields of uniformly massed spheres can be obtained to produce high efficiency photovoltaic cells at a moderate cost.

36 Claims, 2 Drawing Sheets

PROCESS FOR PRODUCING SEMICONDUCTOR SPHERES

TECHNICAL FIELD OF THE INVENTION

This invention relates generally to photovoltaic solar arrays, and more particularly to a method of producing semiconductor spheres of uniform mass for use in a solar array.

BACKGROUND OF THE INVENTION

Photovoltaic devices, commonly known as solar cells, are known in the art for converting the sun's solar energy into useful electrical energy. These solar cells typically comprise a matrix or array of semiconductor spheres embedded in a light-reflective aluminum foil, the semiconductor material typically comprising silicon. One such solar cell is disclosed in U.S. Pat. No. 4,021,323 to Kilby et al., incorporated herein by reference, which includes a solar array composed of a transparent matrix provided with particles of silicon, each particle having a P-region exposed on one matrix surface, and an N-type region extending to an opposed matrix surface. Electrical energy is produced when photons of light strike the silicon sphere and induce electrons to cross the depletion region between the two conductivity types. Another solar cell is disclosed in U.S. Pat. No. 5,028,546 to Hotchikss, incorporated herein by reference.

One previous method of fabricating silicon spheres involves shooting molten purified silicon out of a nozzle, or out of a rotating disk. The spheres formed in this manner are highly irregular in shape and are polycrystalline. These spheres can later be made crystalline with the use of another process, involving re-heating the material above the melting point, and then controllably cooling the material.

Another process for producing crystalline silicon spheres is disclosed in U.S. Pat. No. 4,637,855, incorporated herein by reference. Silicon spheres are fabricated by applying a slurry of metallurgical grade silicon onto the surface of a substrate capable of maintaining integrity beyond the melting of silicon. The layer of silicon slurry is then patterned to provide regions of metallurgical grade silicon. The substrate and silicon slurry are then heated above the melting point of silicon. The silicon beads from the slurry to the surface as relatively pure silicon, and forms silicon spheres due to the high cohesion of silicon. The spheres are then cooled below the melting point of silicon, and the silicon spheres then crystalize.

Other processes, such as disclosed in U.S. Pat. No. 5,069,740 to Levine et al. and incorporated herein by reference, include using a sieve to separate irregular metallurgical grade silicon particles by size. Particles are obtained within a desired size range, and then repeatedly melted and cooled to draw impurities from the silicon to a silicon dioxide skin formed during each melting process. In this manner, particles having a desired degree of silicon purity can be obtained. This silicon dioxide skin is removed after each melting and cooling cycle.

To realize solar cells of high efficiency, it is necessary that the semiconductor spheres be of high purity. High purity silicon spheres can ultimately be obtained by starting with either metallurgical grade, or semiconductor grade silicon. However, the greater the impurity of the starting material, the greater number of melting and grinding cycles that will be necessary to ultimately obtain high purity semiconductor spheres. This purification process is time consuming, requires a substantial amount of energy, and is expensive. These melting cycle considerations need to be balanced against the cost of the starting material. In the past, the cost of semiconductor grade silicon feedstock was very expensive in relation to metallurgical grade silicon feedstock. More recently, however, the cost of off-spec semiconductor grade silicon feedstock is more in line with the cost of metallurgical grade silicon feedstock. Obviously, it is desirable to start with semiconductor material of higher purity where cost and availability parameters permit.

To obtain high efficiency solar cells, not only should the silicon spheres be of high purity, they should also be of uniform size and mass. A typical silicon sphere diameter is preferred to be about 30 mils. This size requirement can be difficult to obtain in high yields. Usually, the more melt cycles that are required and implemented, the lower the ultimate yield of a run.

SUMMARY OF THE INVENTION

The present invention implements a template to measure out uniform-mass piles of semiconductor powdered feedstock, and then at least partially melts these feedstock piles to obtain semiconductor granules of uniform mass. The granules can later be processed into crystalline semiconductor spheres.

The method according to the preferred embodiment of the present invention comprises first placing a template upon a uniform surface. This template has a plurality of spaced apart holes each extending through the template. These holes define predetermined volumes between the template surfaces, and are preferably identical in shape and volume to one another. Next, each of these holes is filled with powdered semiconductor feedstock, preferably, semiconductor grade silicon but which could also be of metallurgical grade. Other semiconductor materials could be used as well, such as germanium and gallium arsenide. After filling the holes with the powdered feedstock, the template is carefully removed from the surface to define a plurality of uniform feedstock piles. Thereafter, the feedstock piles are heated for a brief period of time at a temperature sufficient to at least partially melt the feedstock piles. These feedstock piles are heated until each of the feedstock piles coalesce and form a unitary granule. Thereafter, the granules can be removed from the surface, and may be later heated and controllably cooled to form a crystalline or polycrystalline sphere. The surface tension of the melted silicon granule will cause the granule to define a nearly perfect sphere.

The template implemented includes a dense array of the holes such that a large number of uniform-mass feedstock piles can be measured out and formed into granules simultaneously. Preferably, these holes are formed using a precision drill or laser cutter to achieve precision-sized holes. The powdered feedstock is comprised of particles substantially smaller than the diameter of the holes. This allows the holes to be densely packed and precisionally meter out the powdered feedstock. The holes preferably have a round shape, but could also have a polygon shape to more easily accommodate shard material.

In the preferred embodiment, the template holes are filled by spreading a predetermined quantity of powdered semiconductor feedstock across the template, thus permitting each of the holes to become entirely filled. Thereafter, the excess powdered feedstock is removed from the template by using a smoothing tool, such as by using a doctor blade or fine brush. However, it is contemplated by the present invention that other methods of filling the holes such that they are full but not overflowing can be implemented as well, such as by pouring a sheet of powdered feedstock over the template using well known vibration techniques. Hence, limitation to implementing a doctor blading process is not to be inferred. To ultimately obtain a semiconductor sphere of 30 mils. in diameter, it is preferred that the holes have a 40 mils. diameter, and the template have a 42.5 mils. thickness. However, limitation to these dimensions are not to be inferred. In the preferred embodiment, it is preferred that a uniform layer of silica be formed across a quartz boat to serve as a smooth surface upon which the template is placed. However, it is only desired that the surface have a melting temperature greater than the melting temperature of the powdered feedstock to maintain integrity.

The granules produced according to the present invention can comprise crystalline or polycrystalline spheres if the feedstock piles are melted long enough. Preferably these granules are subsequently remelted and cooled at least once according to other well know processes. Melting and cooling the spheres in an appropriate environment will form an oxidized surface layer which may getter impurities. These oxidized layers are typically removed by conventional HF treatments.

BRIEF DESCRIPTION OF THE DRAWING FIGURES

DESCRIPTION OF THE PREFERRED EMBODIMENT

Figure 1:
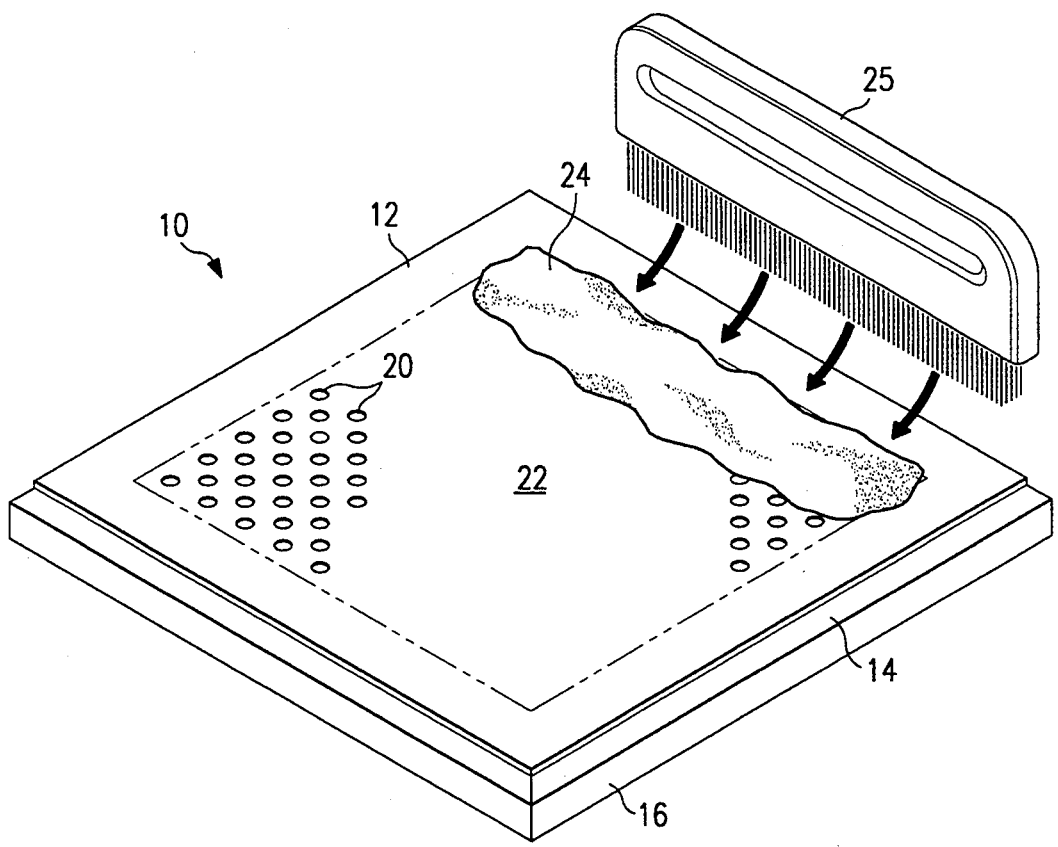
FIG. 1 is a perspective view of a template placed upon a refractory layer, such as silica, provided upon a quartz boat, wherein each of the holes of the template are filled with powdered semiconductor feedstock according to the present invention.

Referring now to FIG. 1, there is shown generally at 10 an apparatus suited to manufacture semiconductor particles of uniform mass according to the preferred embodiment of the present invention. Apparatus 10 is seen to include a template 12 positioned upon a uniform refractory layer 14, preferably comprised of silica. Refractory layer 14 is smoothed and formed upon a quartz boat 16. Each of template 12, refractory layer 14 and quartz boat 16 are coplanar with one another, as shown.

Template 12 is seen to comprise a planar sheet having defined therethrough a plurality of holes 20. Holes 20 together define a large array of holes generally shown at 22. Each of holes 20 preferably has a diameter of 0.04", each hole being arranged on 0.07" centers. Template 12 has a thickness of approximately 0.0425" such that each hole 20 defines a volume of approximately $5.34 \times 10^{-5}$ cubic inches between the template major surfaces. Template 12 is preferably comprised of aluminum, but could also be comprised of plastic or other well known materials if desired. The diameter of holes 20 are identical to one another, and thus are the associated volumes defined by the holes. The diameters of holes 20 vary from one another by no more than 0.002", these tolerances being obtained by using precision drilling equipment to form holes 20 through template 12. This high degree of precision is necessary to obtain uniform mass feedstock piles as will be discussed shortly. The thickness of refractory layer 14 is preferably in the range of 0.2", however, limitation to this dimension is not to be inferred. Both the material comprising refractory layer 14, such as silica, and quartz boat 16 each have melting points exceeding the melting points of the semiconductor material which is processed to the present invention to maintain integrity when heated.

Method of Manufacture

Figure 2:
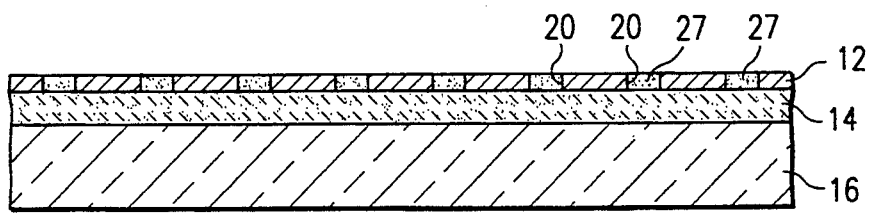
FIG. 2 is a partial cut-away view of the template placed upon the silica and quartz boat and loaded with semiconductor feedstock.

With the foregoing apparatus having now been defined, a method for manufacturing semiconductor particles according to the preferred embodiment of the present invention will now be described in detail. To begin with, a uniform, and preferably smooth, layer of refractory material 14, such as silica is formed upon quartz boat 16 using doctor blade techniques which are well known in the art. Next, template 12 is carefully placed upon smooth layer 14 with careful attention being given to maintaining the smooth upper surface of refractory layer 14. Next, a predetermined quantity of powdered semiconductor feedstock 24 is placed upon array 22. This feedstock 24 is glided across the surface of the array 22 using a smoothing tool 25, such as a doctor blade or smoothing brush, to entirely and evenly fill the volume of each of holes 20 defining array 22. Each of holes 20 is entirely filled with a quantity 27 of feedstock, with the excess semiconductor feedstock being removed from array 22 thereafter, as shown in FIG. 2. The powdered feedstock is preferably comprised of semiconductor grade silicon, however, other semiconductor materials could be implemented such as germanium, gallium arsenide and so forth. While semiconductor grade powdered feedstock is preferred, it is also contemplated by the present invention that metallurgical grade semiconductor feedstock could be implemented if desired, and is thus covered by the scope of the present invention.

Figure 3:
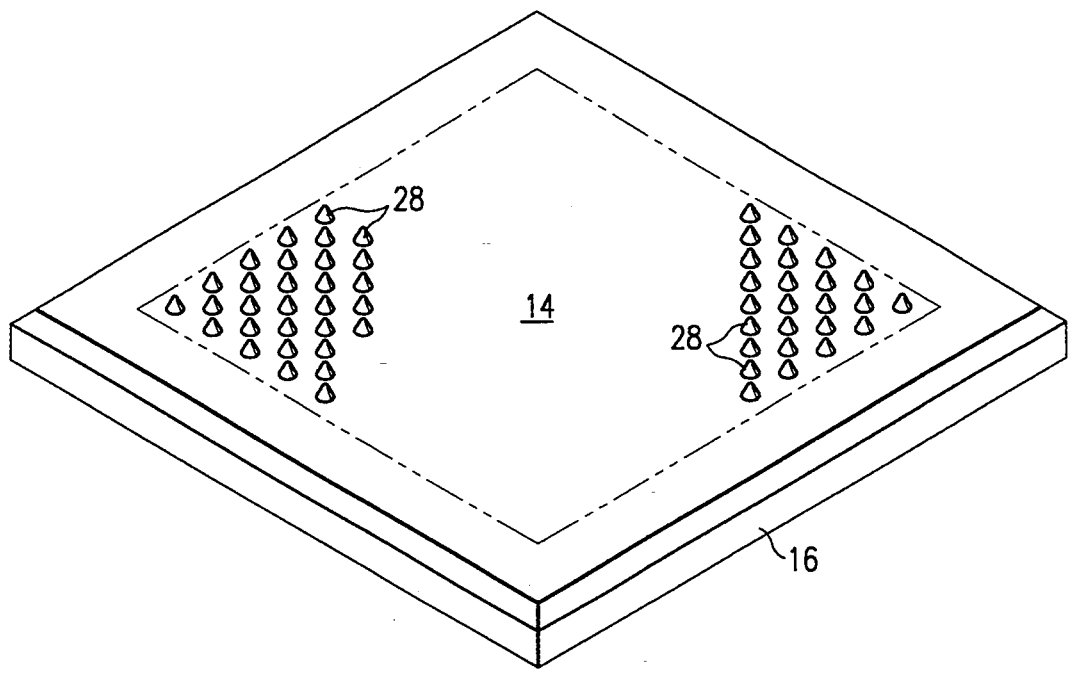
FIG. 3 is a perspective view of the refractory layer and quartz boat with the template carefully removed to define a uniform array of spaced semiconductor feedstock piles.

After each of the holes 20 have been carefully filled with the powdered feedstock as just described, template 12 is carefully removed from the refractory layer 14, as shown in FIG. 3. The powdered semiconductor feedstock 27 that filled holes 20 will dispense therefrom and remain on refractory layer 14, and will form uniformly shaped piles 28 of powdered semiconductor feedstock. Because the template array 22 was formed of uniformly sized and spaced holes 20, each of feedstock piles 28 will also be of uniform mass and spacing, forming a uniform array of feedstock miles as shown in FIG. 3. Therefore, template 12 insures a precision metering of the powdered semiconductor feedstock to obtain feedstock piles 28 of uniform mass.

With the powdered semiconductor feedstock piles 28 now ready to be heated, the quartz boat 16 along with the refractory layer 14 and feedstock piles 28 are placed into a conventional furnace (not shown). Next, this furnace is heated and brought to a temperature slightly greater than the melting point of the powdered semiconductor feedstock. Silicon has a melting point of 1420° celsius, and therefore, the furnace would be brought to a temperature of approximately 1460° celsius. Of course, if germanium or gallium arsenide is implemented as powdered semiconductor feedstock, the furnace would be brought to a temperature slightly greater than their respective melting points. This temperature is maintained for only a short period of time, preferably 30 seconds. This time period is sufficient for the granules of the powdered semiconductor feedstock to begin melting and fuse with one another and form a single particle or cluster. However, the temperature is preferably not maintained above the melting point of silicon for a duration sufficient to allow the feedstock granules to totally melt and coalesce. The present invention is intended to cover heating the feedstock for any chosen duration of time.

Figure 4:
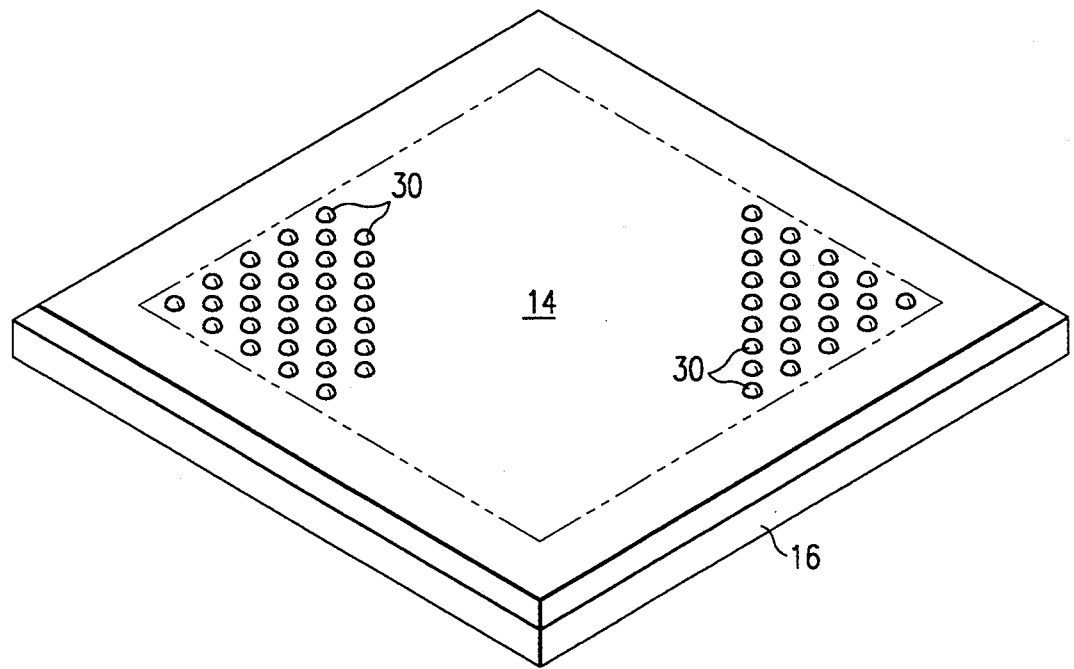
FIG. 4 is a perspective view of the arrangement shown in FIG. 3 after heated to at least partially melt the feedstock piles to form uniform mass granules.

Next, quartz boat 16 is removed from the furnace and the feedstock particles allowed to cool and form particles or clusters 30, as shown in FIG. 4. Thereafter, both the particles 30 and the silica forming refractory layer 14 are separated using conventional sorting or sieve techniques. Because each of the feedstock piles 28 were precisionally metered out during the foregoing process, each of the feedstock particles 30 obtained are of uniform mass. In the preferred embodiment, feedstock particles having a mass of approximately 0.544 milligrams are obtained.

The feedstock piles 28 are only momentarily heated above the melting temperature of the associated semiconductor feedstock such that there is insufficient time for an oxide layer to form about the surface of the cluster 30. These feedstock particles 30 can be subsequently processed using well known techniques to controllably heat the particles above the melting point of the semiconductor feedstock, and then controllably cool the particles to spheroidize the particles. These subsequent heating and cooling steps can be repeatedly done as necessary to obtain an acceptably shaped (sphere) particle. It is important that the particles be controllably cooled so that a single crystal be obtained. However, in some cases, it is sufficient to controllably cool the particle such that a polycrystalline particle is obtained. After each heating and cooling procedure, the particles are cleansed using hydrogen fluoride (HF) acid in a manner well known in the art.

According to the preferred embodiment of the present invention, semiconductor grade powdered feedstock is preferably implemented so that subsequent processing procedures are not necessary to remove impurities from the particles. Of course, if metallurgical grade semiconductor feedstock is implemented according to an alternative preferred embodiment of the invention, subsequent processing and grinding procedures would be necessary.

These semiconductor spheres of uniform mass can be implemented to form photovoltaic cells, such as those described in U.S. Pat. No. 5,028,546 entitled "Method for Manufacture of solar cell with Foil Contact Point," this patent being assigned to the assignee of the present invention, and the teachings of which are incorporated herein by reference. According to the present invention, high efficiency photovoltaic devices can be obtained, these solar arrays providing consistent current and voltages when exposed to solar energy. The high efficiency and consistency of these solar arrays is obtained due to the uniform characteristics of the semiconductor spheres.

While the foregoing method just described is set forth as the preferred embodiment, it is contemplated that variations to the foregoing method can be made without parting from the scope of this invention. For instance, the refractory layer 14 could be comprised of other refractory materials, or eliminated altogether if desired. Further, vehicles other than quartz boats can be used as well. It is only desired that a substantially flat surface be provided to support the feedstock piles 28 as shown in FIG. 3. This surface having a melting point higher than the melting point of the semiconductor feedstock so that it will maintain integrity during the heating step implemented to melt the feedstock piles and obtain a single particle. It is preferred in the present invention to implement a refractory layer 14 comprised of silica, since it is easy to doctor blade and obtain a flat surface, and moreover, because it is easy to separate from the larger semiconductor particles after melting using conventional separating or sieve techniques. The particle size of silica is substantially small and can be easily separated from the semiconductor granules. In addition, silica is affordable, and can be reprocessed for future manufacturing runs according to the present invention. Silica adds very few impurities to the semiconductor particles during the melting process, which is important when obtaining silicon spheres of high purity levels. Some of these impurities are removed or tied-up in subsequent process steps using well-known techniques. The present invention is well suited to automation techniques.

In the preferred embodiment, holes 20 preferably are round. However, it is contemplated that other shapes, such as polygons, could be formed as well. While the shape of the holes is not critical, the volumes defined by these holes in combination with the major surfaces of template 12 is critical. Polygon shaped holes 20 may be preferred in some instances to better accommodate shard semiconductor feedstock granules. In other embodiments, holes 20 may be desired to be tapered outwardly toward the lower major surface of template 12 to better facilitate dispensing the powdered feedstock onto refractory layer 14 when template 12 is removed. The granule size of the powdered semiconductor feedstock is substantially smaller than the diameter of the holes 20, thus, a tight packing arrangement is obtained when holes 20 are filled with feedstock, and renders the doctor blading process practical. While the template 12 shown and discussed implements a single perforated sheet of material, it is also to be contemplated that a continuous perforated sheet with same or other dimensions could be used as well. The spacing of the holes 20 is important in the sense that they cannot be too close or the feedstock piles 28 may touch one another and then would become attached to one another during the melting process. Because the holes 20 can be defined in high densities, high yield runs can be obtained according to the process of the present invention, at a low cost.

Though the invention has been described with respect to a specific preferred embodiment thereof, many variations and modifications will become apparent to those skilled in the art upon reading the present application. It is therefore the intention that the appended claims be interpreted as broadly as possibly in view of the prior art to include all such variations and modifications.

We claim:

1. A method of forming semiconductor particles of uniform mass from powdered semiconductor feedstock, comprising the steps of:
   (a) placing a template upon a surface, said template having a plurality of spaced holes each extending therethrough, each said hole defining a predetermined volume;
   (b) filling said holes with said powdered semiconductor feedstock;
   (c) removing said template from said surface to define a plurality of semiconductor feedstock piles upon said surface; and
   (d) heating said semiconductor feedstock piles at a temperature sufficient to at least partially melt said feedstock piles to obtain said semiconductor particles.

2. The method as specified in claim 1 wherein said template hole volumes are substantially equal to one another.

3. The method as specified in claim 1 wherein said semiconductor feedstock piles are heated in said step (d) until said feedstock piles are at least partially melted together and form a semiconductor granule.

4. The method as specified in claim 1 wherein said semiconductor feedstock piles are heated in said step (d) for a duration until said feedstock piles comprise semiconductor spheres.

5. The method as specified in claim 1 further comprising the step of first forming a uniform refractory layer upon said surface before performing said step (a).

6. The method as specified in claim 5 wherein said refractory layer is comprised of silica.

7. The method as specified in claim 1 further comprising the step of controllably cooling said semiconductor particles, and subsequently reheating said semiconductor particles at least one more time to obtain spherical shaped said particles.

8. The method as specified in claim 6 further comprising the step of forming indentations in said silica layer below said template holes before performing said step (b).

9. The method as specified in claim 8 comprising the step of disposing a pin through said template holes and into said refractory silica layer a predetermined distance to form said indentation.

10. The method as specified in claim 1 wherein said powdered semiconductor feedstock comprises powdered silicon, powdered germanium, or powdered gallium arsenide.

11. The method as specified in claim 1 wherein said powdered semiconductor feedstock is of semiconductor grade.

12. The method as specified in claim 1 further comprising the step of controllably cooling said semiconductor feedstock piles to form single crystal said semiconductor particles.

13. The method as specified in claim 1 further comprising the step of controllably cooling said semiconductor feedstock piles to form polycrystalline said semiconductor particles.

14. The method as specified in claim 1 comprising the step of using said powdered semiconductor feedstock having granules substantially less in size than a diameter of said template holes.

15. The method as specified in claim 1 wherein said template holes define volumes of approximately $3.23 \times 10^{-4}$ cubic centimeters.

16. The method as specified in claim 1 wherein said template holes have substantially identical diameters.

17. The method as specified in claim 1 wherein said template holes have a polygon shape.

18. The method as specified in claim 1 wherein said surface comprises a material having a melting point higher than a melting point of said powdered semiconductor feedstock.

19. The method as specified in claim 18 wherein said surface comprises a quartz boat.

20. A method of forming semiconductor particles of uniform mass from powdered semiconductor feedstock, comprising the steps of:
   (a) placing a template upon a surface, said template having a predetermined thickness and plurality of spaced holes extending therethrough;
   (b) disposing said powdered semiconductor feedstock upon said template such that said semiconductor feedstock fills said template holes;
   (c) using a smoothing tool to remove excess said powdered semiconductor feedstock not occupying said template holes from said template;
   (d) removing said template from said surface to define a plurality of separated semiconductor feedstock piles upon said surface; and
   (e) heating said semiconductor feedstock piles to obtain said semiconductor particles.

21. The method as specified in claim 20 wherein said template hole volumes are substantially equal to one another.

22. The method as specified in claim 20 wherein said semiconductor feedstock piles are heated in said step (d) until said feedstock piles are at least partially melted together and form a semiconductor granule.

23. The method as specified in claim 20 wherein said semiconductor feedstock piles are heated in said step (d) for a duration until said feedstock piles comprise semiconductor spheres.

24. The method as specified in claim 20 further comprising the step of first forming a uniform refractory layer upon said surface before performing said step (a).

25. The method as specified in claim 24 wherein said refractory layer is comprised of silica.

26. The method as specified in claim 20 further comprising the step of controllably cooling said semiconductor particles, and subsequently reheating said semiconductor particles at least one more time to obtain spherical shaped said particles.

27. The method as specified in claim 20 wherein said powdered semiconductor feedstock comprises powdered silicon, powdered germanium, or powdered gallium arsenide.

28. The method as specified in claim 20 wherein said powdered semiconductor feedstock is of semiconductor grade.

29. The method as specified in claim 20 further comprising the step of controllably cooling said semiconductor feedstock piles to form single crystal said semiconductor particles.

30. The method as specified in claim 20 further comprising the step of controllably cooling said semiconductor feedstock piles to form polycrystalline said semiconductor particles.

31. The method as specified in claim 20 comprising the step of using said powdered semiconductor feedstock having granules substantially less in size than a diameter of said template holes.

32. The method as specified in claim 20 wherein said template holes define volumes of approximately $3.23 \times 10^{-4}$ cubic centimeters.

33. The method as specified in claim 20 wherein said template holes have substantially identical diameters.

34. The method as specified in claim 20 wherein said template holes have a polygon shape.

35. The method as specified in claim 20 wherein said surface comprises a material having a melting point higher than a melting point of said powdered semiconductor feedstock.

36. The method as specified in claim 35 wherein said surface comprises a quartz boat.

* * * * *